Nov. 3, 1970 M. J. ST. CLAIR ET AL 3,537,175

LEAD FRAME FOR SEMICONDUCTOR DEVICES AND METHOD FOR MAKING SAME

Filed Oct. 5, 1967 3 Sheets-Sheet 1

INVENTORS
MICHAEL J. St. CLAIR
WILLIAM L. KEADY

LEAD FRAME FOR SEMICONDUCTOR DEVICES AND METHOD FOR MAKING SAME
Filed Oct. 5, 1967 3 Sheets-Sheet 2
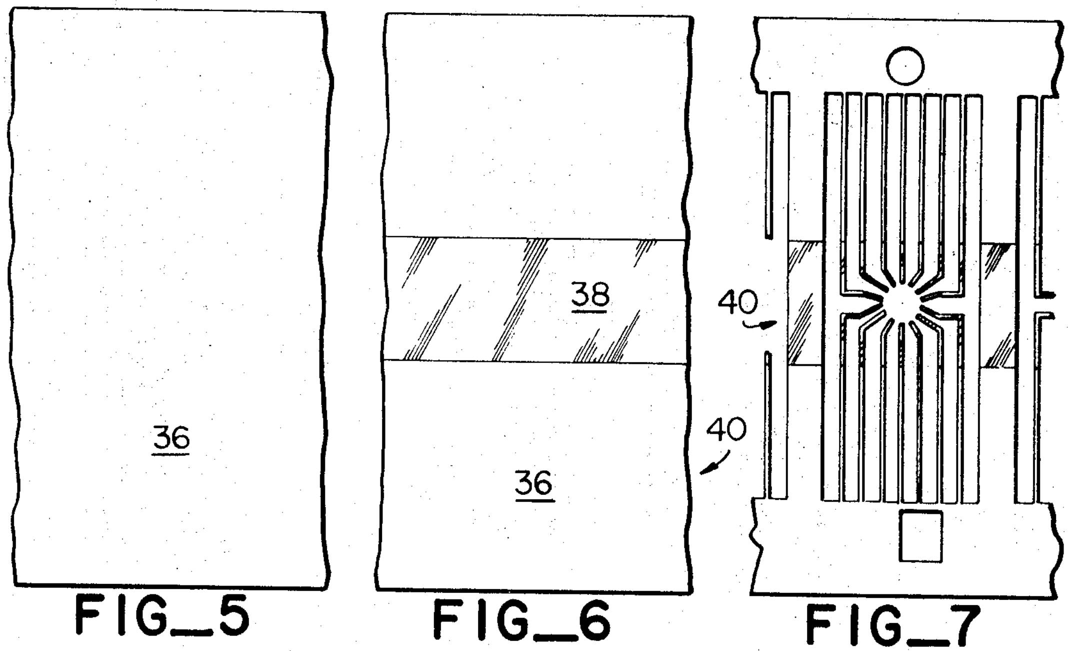
FIG_5 FIG_6 FIG_7
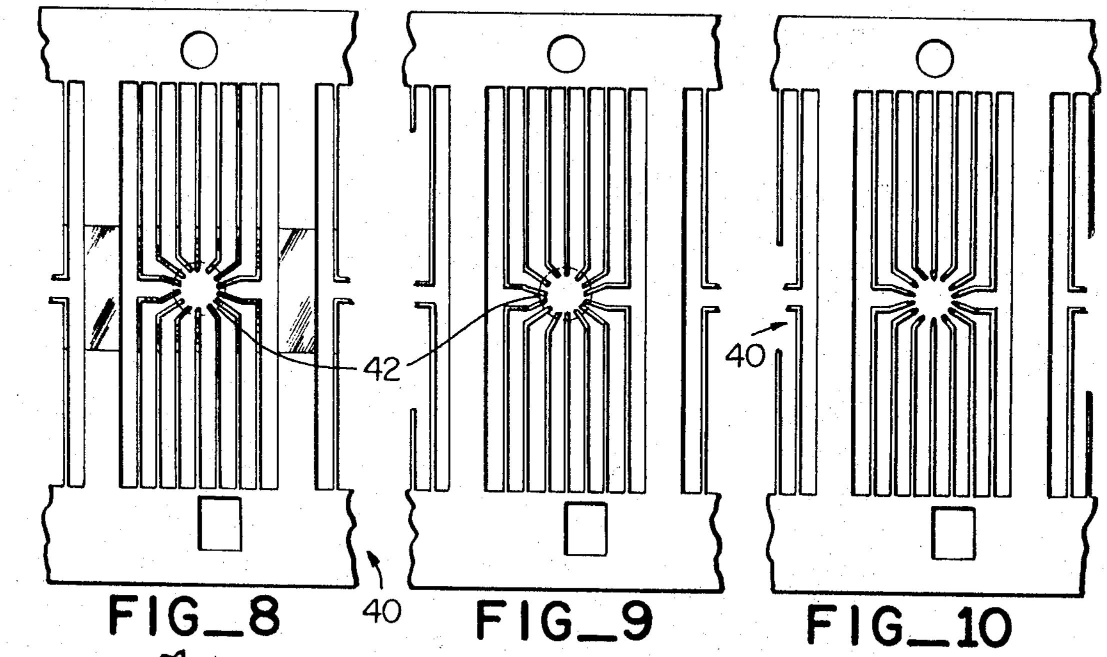
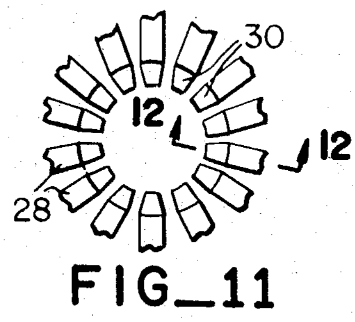
FIG_11
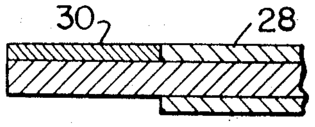
FIG_12
INVENTORS
MICHAEL J. St. CLAIR
WILLIAM L. KEADY INVENTORS
MICHAEL J. St. CLAIR
WILLIAM L. KEADY United States Patent Office
3,537,175
Patented Nov. 3, 1970

3,537,175

LEAD FRAME FOR SEMICONDUCTOR DEVICES AND METHOD FOR MAKING SAME

Michael J. St. Clair and William L. Keady, Woodside, Calif., assignors to Advalloy, Inc., Palo Alto, Calif., a corporation of California Original application Nov. 9, 1966, Ser. No. 593,145. Divided and this application Oct. 5, 1967, Ser. No. 688,638
Int. Cl. H01b *13/00;* H05k *3/00*
U.S. Cl. 29—624 7 Claims

ABSTRACT OF THE DISCLOSURE

A layer of relatively soft conductive material is deposited longitudinally on a narrow strip of flexible metal material. The strip is stamped to form a plurality of integrally connected lead frames with narrow lead portions, masked, etched to remove portions of soft conductive material, plated, and bonded to substrate supporting tips of lead portions having a layer of soft conductive material.

This application is a division of application Ser. No. 593,145, filed Nov. 9, 1966, now abandoned.

This invention relates to improvement in lead frames for use in combination with semiconductor or integrated circuit devices for electronic systems and more particularly it relates to an improved method for manufacturing such lead frames.

The development of integrated circuit devices in the form of small dies or chips provided an important advance in the electronic art because of their ability to provide varied and complicated circuits containing a multiplicity of elements including semiconductors, resistors, capacitors, etc., in extremely small units. However, with their small size and complexity a problem arose of packaging these miniature devices with other components, particularly with respect to providing conductive paths to their numerous terminal points and to supporting them properly in different electronic components. One approach to this problem was to provide a device called a lead frame, in essence, a rigid member supporting a plurality of conductive leads in a prearranged pattern to which the semiconductor or integrated circuit device could be connected. One general object of the present invention is to provide an improved lead frame of the aforesaid type.

Another object of our invention is to provide a large plurality of lead frames for semiconductor devices that are integrally connected together in a strip form which makes them easy to handle and transport, and also particularly adaptable for use in subsequent automated electronic component manufacturing operations.

Still another object of the present invention is to provide an improved lead frame for semiconductor devices that has a high degree of electrical efficiency, is small, yet strong and durable and thus able to support an integrated circuit device with the proper rigidity.

Another important object of our invention is to provide a lead frame comprised of a flat base metal material in the form of a supporting frame and integral, narrow lead portions arranged in a predetermined pattern and with a layer of a relatively soft conductive material on each lead portion that is retained thereon by a permanent metallurgical bond, thereby providing a means for connecting these lead portions to other components having a quality and a durability heretofore unattainable on such devices.

With the increased use of a wide variety of semiconductor devices in electronic apparatus of all types, a problem arose of manufacturing lead frames of the aforesaid type in extremely large quantities, while providing the necessary quality control of each unit within the required dimensional, metallurgical and electrical limits. Accordingly, another object of the present invention is to solve this problem and provide a unique method for manufacturing lead frames that accomplishes the aforesaid objectives. Moreover, it is an object of our invention to provide a method that accomplishes a high rate of production at a minimum expenditure of time and labor; that is particularly adaptable to automation and thereby provides an unusual ease and economy of manufacture.

Another specific object of the present invention is to provide a method for manufacturing lead frames in large quantities, wherein all lead frames have the same predetermined plan form configuration including a multiplicity of conductive leads arranged in a predetermined pattern, all leads having a layer of a conductive metal material at their tips so as to be readily connectable to terminals on a semiconductor device such as an integrated circuit chip or wafer.

A further object of the present invention is to provide a method for manufacturing a large plurality of lead frames of the same configuration in a relatively long strip wherein each step of the method is performed while the strip remains intact. Thus, the end product comprising a large plurality of lead frames can be rolled up as a tight coil or reel and maintained in this form for handling and shipping until subsequent use by manufacturer of electronic components.

Another object of our invention is to provide a method for manufacturing a large plurality of lead frames in the form of a long strip which includes steps for metallurgically bonding a layer of a relatively soft conductive material to the strip and then masking, etching and stamping the strip so that the multiple lead portions of each frame have a permanent, durable layer of conductive material on their tips which is bondable to other electronic components.

Other objects, advantages, and features of the present invention will become apparent from the following detailed description which is presented in conjunction with the accompanying drawings in which:

FIGS. 5–10 are enlarged fragmentary views showing the method steps for forming a lead frame according to the present invention;

FIG. 11 is a greatly enlarged fragmentary view showing the central portion of one lead frame with the terminating lead portions;

FIG. 12 is a fragmentary view in section taken along the line 12—12 of FIG. 11;

Figure 2:
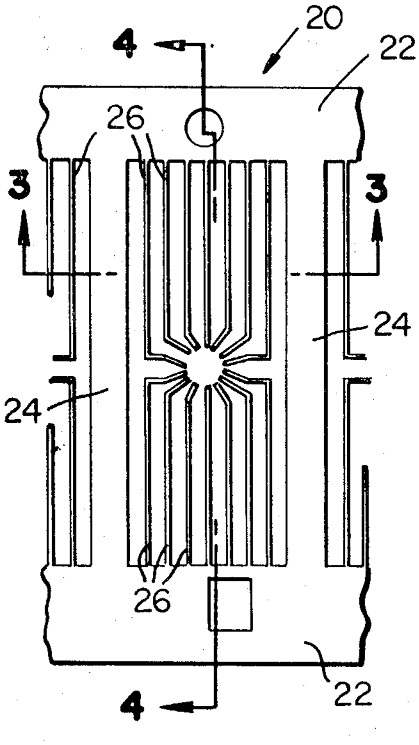
FIG. 2 is an enlarged fragmentary plan view of a portion of the reel strip showing one of the lead frames thereon.
Figure 4:
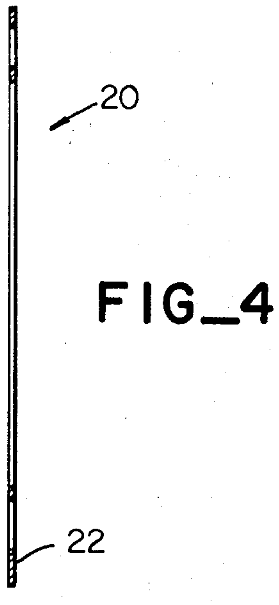
FIG. 4 is an enlarged view in section taken along the line 4—4 of FIG. 2.
Figure 3:
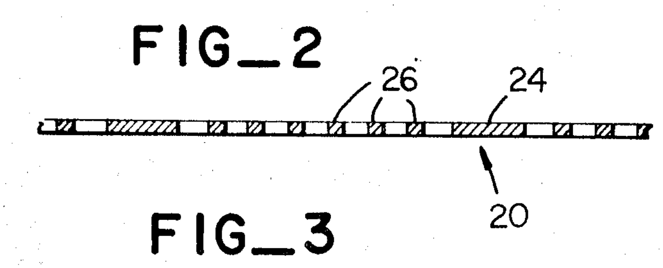
FIG. 3 is an enlarged view in section taken along the line 3—3 of FIG. 2.
Figure 13:
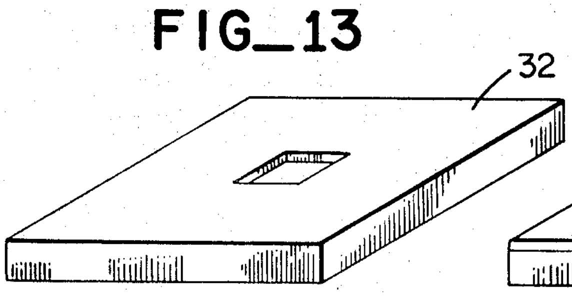
FIGS. 13–16 are enlarged views showing additional method steps for attaching a substrate to our lead frame according to the present invention.
Figure 14:
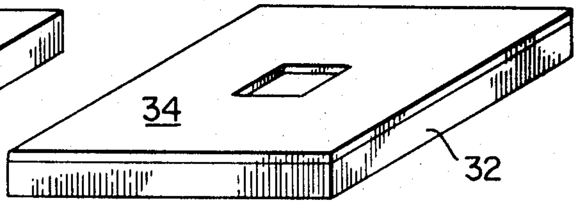

Referring to the drawing, FIG. 2 shows a single lead frame 20 embodying the principles of the present invention which is used in electronic components and apparatus for supporting and providing electrical current carrying paths to a semiconductor device such as an integrated circuit wafer. This particular lead frame configuration has a rectangular shape with integral end and side bar portions 22 and 24. Extending inwardly from the opposite end portions of the outer frame and in the same plane thereof are a plurality of parallel, spaced apart portions called leads 26. The latter may be straight or they may bend at various angles near their ends within the frame and then terminate at spaced apart locations in a predetermined pattern such as the circular pattern shown. The entire lead frame is essentially flat with the outer frame and the opposing lead portions of conductive material all being in the same plane and having substantially the same thickness. It is to be understood that the lead frame configuration shown throughout the drawings is for illustrative purposes only and is not to be considered as limiting the scope of the invention.

A conductive material from which the frame and its lead portions are formed is a semirigid but flexible metal sheet such as steel. This sheet has a uniform thickness, e.g., in the range of .004″ to .010″, and preferably the leads 26 are covered with a layer of a metal that will provide corrosion resistance, bondability, solederability and sealability with other materials. For example, a gold layer 28 may be applied having a thickness of from 100 to 300 microinches, as shown in FIG. 12. At the tips 30 of all the leads on each frame is a small deposit of aluminum or some other relatively soft metal which provides a bonding means for aconductor wire that will later be used to interconnect the lead frame with the integrated circuit wafer. The thickness of this bonding deposit on each lead tip may vary from 100 to 300 microinches.

Figure 19:
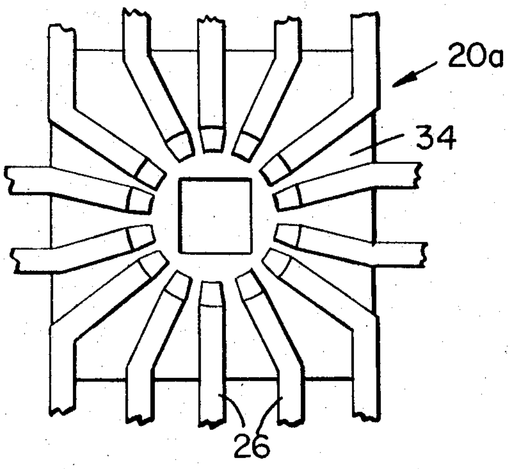
FIG. 19 is a plan view taken along line 19—19 of FIG. 17.

For some applications, as shown in FIG. 19, a lead frame 20*a* may be combined with a substrate unit 32 which forms a mounting base for the leads 26 within the frame area. In this instance the leads of each frame are bonded firmly to the substrate unit, which may be ceramic or plastic, as by means of a glass frit sealing layer 34 on its upper surface. When the lead frame is subsequently used by an electronics component manufacturer an integrated circuit die may be positioned on and bonded to the substrate unit 32 with the die terminals connected to the lead tips 30.

Figure 1:
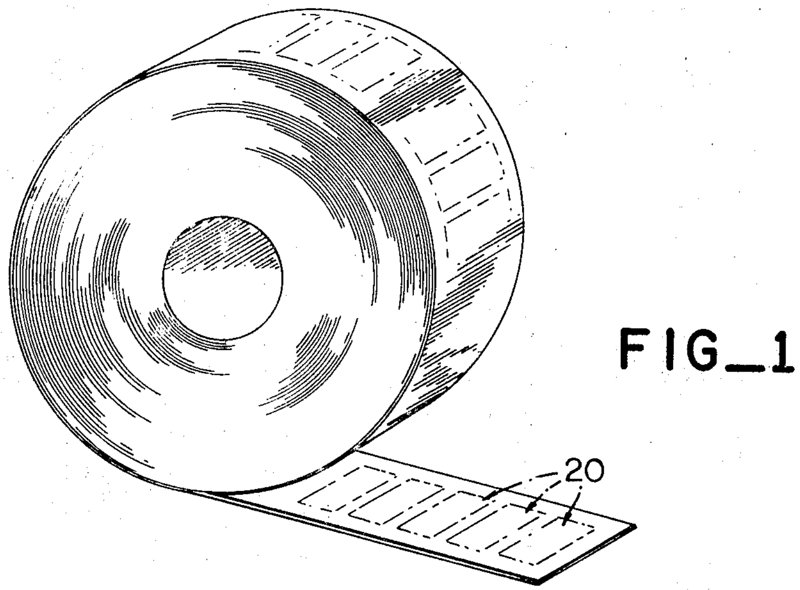
FIG. 1 is a view in perspective showing a plurality of lead frames in strip form according to the present invention and rolled up in a compact reel.

An important feature of our invention as illustrated in FIG. 1 is the fact that the completed lead frames 20 or 20*a* are maintained in the form of a relatively long strip which is sufficiently flexible to enable it to be wound up in a reel. This is highly advantageous to electronic component manufacturers who use such lead frames in large quantities, since it greatly facilitates the use of automated manufacturing arrangements when the lead frames are subsequently combined with or incorporated in other electronic components in the manufacture of various electronic apparatus.

The unique method for producing the completed lead frames 20 in reel form according to the present invention may be described with reference to FIGS. 5–10. Our first step (FIG. 5), is to provide a strip of metal stock 36 having a uniform width and a thickness which causes it to be semirigid and sufficiently flexible to enable it to be coiled in a reel. It has been found that for various reasons a glass-to-metal sealing alloy, e.g., ASTM No. F15–61T, provides a satisfactory base frame structure. When received in its raw form in coiled reels the incoming stock is given a close inspection to insure its conformance with dimensional specifications and its correct physical properties. It is particularly essential to check the camber of the material to see that it does not exceed 1/16 inch per 36 inches so that it will not cause difficulties during the subsequent stamping step. The dimensional specifications may be checked by micrometer and the camber measured by placing the stock against a straight edge and measuring any discrepancies.

Another sub-step to step one in preparing the flat, flexible strip material 36 is to remove any organic contaminants from it and thereby insure the successful deposition of metal in later steps. This degreasing step can be accomplished by threading the coiled stock through a degreasing barrel which contains a solvent vapor such as trichloroethylene vapor at 95° F.

A further preliminary step in preparing the stock is to straighten it on a six-inch steel core so that the coiled sides are smooth. This assures that the coil alignment remains constant as the stock is unwound during the subsequent deposition of metal step and that the metal deposit is thus consistently centered longitudinally on the strip of stock. This straightening may be accomplished by dropping the degreased coil into a metal jig and tapping the uneven loops into place with a rubber hammer.

The next or second major step in our method, as shown in FIG. 6, is to deposit a relatively thin uniform layer of soft, conductive material, longitudinally along the center of the elongated strip 36 provided in the first step. More specifically, the purpose of this step is to deposit this soft conductive material on the flexible metal strip so that the tips of the lead portions which will be formed later will be provided with a bondable surface that will enable the lead frame to be connected to other electronic components such as an integrated circuit wafer or chip.

Various ways can be employed for applying the soft conductive layer to a strip of harder material but to achieve the correct thickness of this layer with a lasting bond as required in order to provide a superior product, a method of vapor deposition is utilized in accordance with our invention. This step is accomplished by first providing a unit with a vacuum chamber having a preheated crucible into which the soft conductive material is fed. One satisfactory soft conductive material to use is aluminum which can be readily vaporized and condensed on to the metal strip as the latter is moved above it. The variation in the width of the aluminum strip (designated by the numeral 38) on the flexible metal strip 36 is accomplished by means of suitable masking. To provide an unusually durable and permanent bond between the aluminum and the stock or base metal which is essential to a satisfactory product, we have discovered that a metallurgical bond must be achieved between these metals. The term, "metallurgical bond," means that the interface between the softer conductive material such as aluminum, and the base material (the flexible metal) becomes an actual alloy of these two metals. To achieve this metallurgical bond the base strip 36 is itself heated as the vapor deposition takes place. This heating may be done by a suitable means such as an electron beam directed at the strip stock just before it enters the vapor depositing area. Here the strip stock is held at a critical temperature so that its heat content combined with the heat of condensation of the vaporided metal being deposited causes the latter to wet or flow on the base metal. For example, for aluminum we have found that a base material of ASTM No. F15–61T should be preheated to a nominal temperature of about 500° C.

The rate of travel of the strip 36 in the vacuum chamber during this vapor deposition step determines the thickness of the layer of aluminum applied to the strip. This thickness may be varied to suit different situations but generally it is in the range of 100 to 300 microinches. Other factors which may affect the thickness of the soft conductive material such as aluminum applied during the vapor deposition step are the amonut of heat applied to the crucible and the degree of the vacuum provided in the chamber. These are interdependent variables which affect the rate of the evaporation and thus the rate of deposition of aluminum on the flexible metal strip.

Although vapor deposition is a preferred way of applying a relatively soft conductive layer to the flexible metal strip, other conventional cladding or laminating methods could also be used for this step of the method. For example, conventional cladding wherein one metal is rolled onto another metal may be used. However, this will not provide the highly desirable metallurgical bond, and the results produced by this method are not as good as those produced by vapor deposition. Another advantage of our vapor deposition method of cladding the flexible metal strip in the optimum manner is that the grain structure of the base metal is not affected except precisely in the bond area. Thus, a good bond can be obtained while still retaining the base metal in its ductile form.

After the cladding step has been completed the clad strip 40 is inspected carefully to assure that a proper bond with the proper thickness of metal has been attained. Clad stock which has been scorched, burned, contains pin holes or has not bonded well, is rejected. The cladding thickness is also checked by suitable means, but cladding flaws may be detected visually or by means of adhesion and heat tests.

The next step in our method for manufacturing a lead frame, as shown in FIG. 7, is to perforate the clad strip 40 into the desired pattern of the lead frame. This step is accomplished by passing this strip of flexible metal material with its layer of aluminum along its central area through a stamping die. To achieve precision and accuracy in cleanly cut lead frames, a progressive die operation is utilized. Thus, at the end of this step as shown in FIG. 8, the strip now is continuously stamped with the lead frame configuration and a layer of aluminum extends across the center portion of each lead frame. Following the stamping step the entire strip of lead frames is preferably checked by means of an optical comparator for dimensional accuracy, and when rewound it is ready for the next step. If any portions of a strip have improperly formed lead frames in any way, they can be cut out and the ends can be spot welded together so that a long continuous strip can be maintained.

Before the next step, it is preferable at this point that the stamped and clad strip of partially formed lead frames be degreased again to remove any contaminant material that may be accumulated and to prepare the strip for masking.

As shown in FIG. 8, the next step in our method is to mask portions of the strip with a suitable material to prepare the strip for removal of aluminum cladding on areas where it is not needed on the final product. Thus, the purpose of the masking, indicated by the numeral 42, is to protect and prevent removal of aluminum cladding from the tips of the leads of each frame during an etching process that removes the remaining aluminum, and another purpose is to protect the aluminum cladding during a gold-plating step. This masking step, on the lead frames, may be done by hand by applying a material such as liquid vinyl to the desired areas that are to be protected during the etching and plating steps. However, it can also be done by a continuous process by placing the coil of lead frames between two coiled metal masks and threading them through rollers while passing them under a vinyl spray gun, the lead frames being sandwiched between the two masks. For example, a top mask allows the masking material to cover only those areas of cladding that are to remain on the finished product (i.e., the tips of the leads). An undermask provides protective support for the fragile leads and prevents underspraying while being sturdy enough to be subjected to a positive pull. After passing under a spraygun, the two masks and the lead frame coil are immediately separated and the lead frames pass through an infrared drying oven at approximately 185° F. The latter provides a means for curing the vinyl at a rate that controls any pin holes that may tend to form in the mask. The top mask is passed through an acetone tank and is scrubbed automatically, thus being continuously cleaned before being recoiled. Various types of masking material may be used during this step, but it is preferred that a vinyl composition material of a suitable type commercially available be employed and mixed with a reducer in a two to three ratio.

In the next step of our method the unwanted aluminum cladding is removed by an etching process, that is, the aluminum on the metal strip other than the aluminum on the tips of the leads is all removed. To carry out this step of the method (FIG. 9), the coil of stamped aluminum tipped and masked lead frames may be threaded through rollers and passed through an etching tank containing sodium hydroxide at a temperature of 160–180° F. while preferably subjected to ultrasonic vibrations. As the strip of stamped lead frames emerges from the etching tank it is rinsed in tap water to remove the etch material and also in deionized water to prevent a deposition of calcium and other residue that tend to form what are commonly known as water spots. The strip is then preferably run through baths of diluted sulfuric acid, tap water, deionized water, alcohol and a 100° F. drying oven before it is recoiled.

To produce a strip of lead frames on which the aluminum is thoroughly removed as well as other contaminating materials or calcium deposits, the speed of the strip being processed through these agents can be varied as well as the pH factor of the acid and the hydroxide, and the temperature of the drying oven. The use of ultrasonic vibrations in the etching tank can also increase the etching efficiency.

The next step in our method for forming a continuous strip of lead frames is to gold-plate portions of the surface of each of the lead frames in the continuous strip. This plating provides a corrosion-resistant coating for the leads which is solderable at their ends opposite the aluminum tipped ends, and also a surface which is glass-sealable and is very conductive electrically. The actual plating of the gold material can be accomplished electrolytically by conventional means and as in previous steps, this plating is accomplished in the present invention continuously along the strip by passing it through the electrolytic bath. Since the lead tips of each frame are still covered with the masking material, no gold is applied at these localities.

Prior to the application of the gold-plating, a layer of nickel-plating may be applied on the lead frames by running the strip first through a nickel electrolytic bath and then one of gold. This layer of nickel-plating serves to improve the heat resistance of the lead frame and also reduces the thickness of the layer of gold required and therefore the ultimate cost of the lead frame. Another method of cost reduction is to mask those portions of the frame where gold is not necessary.

The next step in our method for manufacturing lead frames in a continuous strip is the removal of the vinyl masking on the aluminum tips of the leads on the frames. This is accomplished by threading the lead frame coil through a series of rollers and through a tank of acetone maintained at room temperature by the use of cooling coils. The use of ultrasoncis in the tank accelerates the dissolving of the vinyl by the acetone. As the strip emerges from this tank, samples may be taken for quality control purposes and the lead frames are then passed through a solution of five parts water to one part sulfuric acid to remove any remaining vinyl film.

As part of the inspection of the coiled lead frame strip, the gold thickness of the frames may be measured by a suitable instrument and the plating itself may be scrutinized with a metallograph, the defective parts being marked and then later removed so that the remaining portions of the strip can be spliced together.

The method according to the present invention as described thus far provides a plurality of lead frames 20 in a reel form that are salable to various electronic component manufacturers for use in different ways to produce various component packages. To make our lead frame particularly useful in the subsequent assembly of certain electronic components, a substrate unit 32 may be connected to each lead frame while it still remains in strip form. The purpose of the substrate unit is to provide a base support for the frame leads and for an integrated circuit die that will later be fixed thereto and connected to the tips of the leads. The installation of a substrate element on each lead frame of a long strip that can be maintained in reel form is accomplished by a series of additional method steps which will now be described in detail in conjunction with FIGS. 13 to 17.

In the first additional step a large plurality of substrate members, which may be formed from a suitable non-conductive, heat-resistant material, are provided. For example, a ceramic such as aluminum oxide may be used, each such member being initially cut to the desired plan form shape. The ceramic material of each substrate member has a uniform thickness and is preferably provided with a centrally located recessed area on its upper surface. Laminated to the upper surface of the main substrate is a thinner layer 34 of a low temperature glass frit. The latter may be provided in the form of a slurry comprised of a binder with partially fused powdered glass materials which may include such materials as alkalies, boric acid, and lime with silica or lead oxide. This glass frit may be applied as a semi-liquid by painting. It is then heated to a temperature below its vitrification level to form a glaze having a uniform thickness (e.g., .005″) on the surface of the substrate material.

Figure 15:
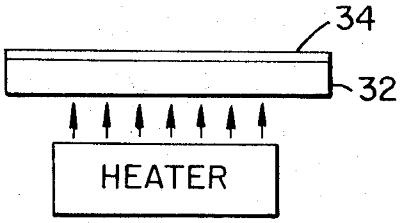
Figure 16:
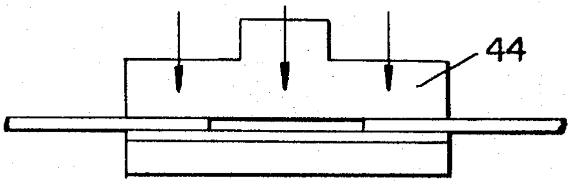
Figure 17:
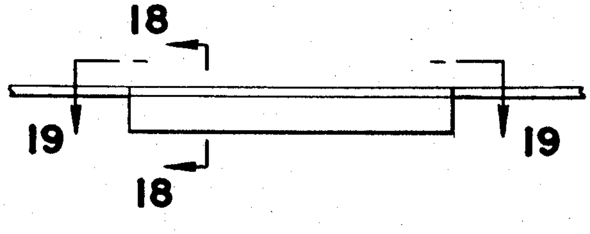
FIG. 17 is a fragmentary view in elevation showing a lead frame attached to a substrate according to the invention.
Figure 18:
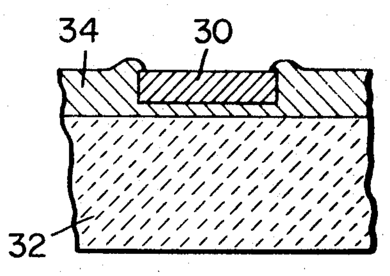
FIG. 18 is a view in section taken along line 18—18 of FIG. 17.

In the next additional steps of our invention, the substrate units 32 as described above, are positioned within a lead frame 20 so that the ends of the leads 26 extend inwardly beyond the edges thereof. As shown in FIG. 15, the substrate is heated again so that the glass frit becomes soft and viscous. At this point pressure is applied on the leads of the lead frame causing them to sink into the frit and become bonded thereto (FIG. 16). The leads may be held by a suitable press 44 in the bonding position for a length of time to achieve the desired bonding strength. This dwell time and the pressure applied may vary for different frit compounds and lead frame configurations, as well as other factors.

The aforesaid step of bonding the leads 26 to the substrate is accomplished for each lead frame while they remain integrally connected in strip form as in all the previous method steps of our invention. Thus, the strip of lead frames each having an attached substrate can be maintained and shipped in a reel form for use by electronic component manufacturers.

As shown in FIG. 19, when the completed lead frames are used by a component manufacturer an integrated circuit die may easily be placed within the substrate recess and then bonded to the glass frit layer by reheating the unit. The versatility in adapting our lead frame to a wide variety of semiconductor devces and the remarkable saving in time, labor and overall cost afforded by our method for making such frames, has provided a significant contribution to the art.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:

1. A method for making a multiplicity of lead frames for use in combination with semiconductor devices in the form of a long flexible and coilable strip, said method comprising the steps of:

providing an elongated strip of flexible sheet metal material having a uniform width and thickness;

preheating said strip to a predetermined temperature level and then vapor depositing a relatively thin uniform layer of conductive material longitudinally along one side of said strip so that a metallurgical bond is formed between said layer and said strip material;

removing by mechanical means portions of said strip of material to produce a repetitious lead frame pattern having integral frame sections with spaced apart lead portions extending within each frame section and terminating at tip portions;

masking with etch resist material predetermined portions of the flexible metal strip including said lead tip portions of each frame section;

removing all of the conductive material deposited along the base strip except the masked portions including the lead tip portions within each frame section by etching;

and removing the masking material from the flexible metal strip leaving each frame section with conductive bonding material on the lead tip portions.

2. A method for making a multiplicity of lead frames for use in combination with semiconductor devices in the form of a long flexible and coilable strip, said method comprising the step of:

providing an elongated strip of flexible sheet metal material having a uniform width and thickness;

vapor depositing a thin uniform layer of a relatively soft conductive material longitudinally along one surface of said strip;

stamping said strip of material to remove portions thereof and to produce a repetitious lead frame pattern having integral frame sections with spaced apart lead portions extending within each frame section in the area of said deposited conductive material and terminating at tip portions;

masking predetermined portions of the flexible metal strip including said lead tip portions of each frame section;

passing the strip through an etching liquid to remove all of the deposited conductive material except that under the masked portions including the lead tip portions;

plating the elongated flexible metal strip with a conductive metal material covering the lead portions of each frame section except for the masked portions thereof; and removing the masking material from the flexible metal strip leaving each frame section with a layer of conductive material on the lead tip portions and plated material on the remainder of the lead portions of each frame section.

3. The method as described in claim 2 wherein the plating step comprises passing the masked strip of flexible metal through a first electrolytic bath of nickel and then a second electrolytic bath of gold to form a composite layer on the lead portions of each lead frame.

4. The method as described in claim 2 wherein the vapor deposition step comprises:

heating a supply of soft conductive material to its vapor temperature in a vacuum chamber;

heating the flexible metal strip so that its heat content combined with the heat of condensation of the vaporized material being deposited causes the latter to wet or flow on the flexible metal strip;

passing said flexible metal strip through the vapor;

and allowing said flexible metal strip and the deposited conductive material to cool before rewinding said strip into a coil.

5. A method for making a multiplicity of lead frames for use in combination with semiconductor devices in the form of a long flexible and coilable strip, said method comprising the steps of:

providing an elongated strip of flexible sheet metal material having a uniform width and thickness;

heating said strip to a predetermined temperature level while simultaneously depositing a relatively thin uniform layer of conductive material longitudinally along one side of said strip;

removing by mechanical means portions of said strip of material to produce a repetitious lead frame pattern having integral frame sections with spaced apart lead portions extending within each frame section and terminating at tip portions;

masking with etch resist material predetermined portions of the flexible metal strip including said lead tip portions of each frame section;

removing all of the conductive material deposited along the base strip except the masked portion by etching;

removing the masking material from the flexible metal strip leaving each frame section with conductive material on the lead tip portions;

providing a plurality of substrate units each having an upper layer of a low temperature glass frit;

positioning one said substrate unit within each said lead frame so that end portions of the leads are located directly above the glass frit of said substrate unit;

heating said substrate unit until said glass frit is viscous but below the vitrification temperature thereof;

pressing the lead end portions into said frit;

and cooling said substrate unit.

6. A method for making a multiplicity of lead frames for use in combination with semiconductor wafers in the form of a long flexible and coilable strip, said method comprising the steps of:

providing an elongated strip of flexible sheet metal material having a uniform width and thickness;

metallurgicall bonding a thin uniform layer of relatively soft conductive material longitudinally along one surface of said strip by simultaneously heating said strip to a temperature around 500° C. and vapor depositing said soft conductive material thereon;

removing by mechanical means portions of said strip of material to produce a repetitious lead frame pattern having integral frame sections with spaced apart lead portions extending within each frame section and terminating at tip portions;

masking with etch resisto material predetermined portions of the flexible metal strip including said lead tip portions of each frame section;

removing all of the soft conductive material previously bonded to the flexible metal strip except the masked portions including the lead tip portions within each from section by etching;

removing the masking material from the flexible metal strip leaving each frame section with soft conductive material on only the lead tip portions in each frame section;

and bonding a substrate unit to the soft conductive material lead portions of each frame section.

7. The method as described in claim 6 wherein the latter step comprises:

providing a plurality of substrate units each having an upper layer of a nonconductive bonding material;

positioning a said substrate unit within each said lead frame section so that the ends of the lead portions are located directly above said layer of bonding material of the substrate unit;

and pressing said lead portions into said bonding material.

References Cited

UNITED STATES PATENTS

| | | | |
|---|---|---|---|
| 3,080,640 | 3/1963 | Jochems | 29—630 |
| 3,297,442 | 1/1967 | Spiers | 156—3 XR |
| 3,317,287 | 5/1967 | Caroiciolo. | |
| 3,388,048 | 6/1968 | Szabo | 204—15 |
| 3,413,713 | 12/1968 | Helda et al. | |
| 3,404,213 | 1/1969 | Brookover. | |

FOREIGN PATENTS

| | | |
|---|---|---|
| 963,376 | 7/1964 | Great Britain. |

OTHER REFERENCES

IBM-TBM, plating process, by Hewin et al., vol. 2, No. 3, October 1959.

JOHN F. CAMPBELL, Primary Examiner

R. W. CHURCH, Assistant Examiner

U.S. Cl. X.R.

29—193.5, 197, 589, 590, 625, 630; 113—119; 117—212; 156—3, 6; 174—52, 68.5; 204—15, 37; 317—234